United States Patent
Bindseil et al.

(10) Patent No.: US 10,658,109 B2
(45) Date of Patent: *May 19, 2020

(54) SYSTEM AND METHOD FOR ELECTROMAGNET COIL CONSTRUCTION AND OPERATION

(71) Applicant: SYNAPTIVE MEDICAL (BARBADOS) INC., Bridgetown (BB)

(72) Inventors: Geron André Bindseil, Toronto (CA); Chad Tyler Harris, Toronto (CA); William Bradfield Handler, Toronto (CA); Blaine Alexander Chronik, Toronto (CA)

(73) Assignee: SYNAPTIVE MEDICAL (BARBADOS) INC., Bridgetown (BB)

( * ) Notice: Subject to any disclaimer, the term of this patent is extended or adjusted under 35 U.S.C. 154(b) by 172 days.

This patent is subject to a terminal disclaimer.

(21) Appl. No.: 15/837,123

(22) Filed: Dec. 11, 2017

(65) Prior Publication Data

US 2018/0102215 A1    Apr. 12, 2018

Related U.S. Application Data

(63) Continuation of application No. 14/894,212, filed as application No. PCT/CA2014/000874 on Dec. 9, 2014, now Pat. No. 9,842,689.

(51) Int. Cl.
*H01F 41/04*    (2006.01)
*G01R 33/385*    (2006.01)

(52) U.S. Cl.
CPC ........... *H01F 41/04* (2013.01); *G01R 33/385* (2013.01); *G01R 33/3854* (2013.01)

(58) Field of Classification Search
CPC .............. G01R 33/385; G01R 33/3854; G01R 33/0052; G01R 33/381; G01R 33/3875; H01F 41/04

See application file for complete search history.

(56) References Cited

U.S. PATENT DOCUMENTS 5,585,724 A    12/1996    Morich et al.
6,728,276 B2    4/2004    Shapiro et al.
(Continued)

FOREIGN PATENT DOCUMENTS

CN    1459030 A    11/2003
CN    1714300 A    12/2005
(Continued)

OTHER PUBLICATIONS

SIPO, First Examination Report (with English translation), dated Jan. 14, 2019, re Chinese Patent Application No. 201480084348.1.
(Continued)

*Primary Examiner* — Rishi R Patel
(74) *Attorney, Agent, or Firm* — Perry + Currier Inc.

(57) ABSTRACT

A method of manufacturing electromagnet coils for use in a magnetic resonance imaging (MRI) system is provided. The method comprises forming a coil representation of a coil surface for the electromagnet coils; setting a plurality of performance metric requirements for a plurality of performance metrics for the electromagnet coils, the plurality of performance metrics including a magnetic field-shape metric and an eddy-field metric; forming a performance functional, based on the coil representation and the plurality of performance metrics, for generating a current density pattern over the coil surface; optimizing the performance functional based on the plurality of performance metric requirements; generating a current density pattern over the coil surface based on the minimized performance functional; and obtaining coil windings from the current density pattern.

21 Claims, 10 Drawing Sheets

(56) References Cited

U.S. PATENT DOCUMENTS

| | | | | |
|---|---|---|---|---|
| 9,842,689 | B2* | 12/2017 | Bindseil | .......... H01F 41/04 |
| 10,024,936 | B2* | 7/2018 | Bindseil | .......... H01F 41/04 |
| 2004/0239325 | A1 | 12/2004 | Hardy et al. | |
| 2010/0268514 | A1 | 10/2010 | Liu et al. | |
| 2018/0299523 | A1* | 10/2018 | Bindseil | .......... H01F 41/04 |

FOREIGN PATENT DOCUMENTS

| | | |
|---|---|---|
| CN | 102188246 A | 9/2011 |
| JP | H1094532 A | 4/1998 |
| JP | H11267112 A | 10/1999 |
| JP | 2006506155 A | 2/2006 |
| JP | 2008024240 | 2/2008 |

OTHER PUBLICATIONS

Bindseil, Geron Andre et al., "System and Method for Electromagnet Coil Construction and Operation", U.S. Appl. No. 14/894,212, filed Dec. 9, 2014.

Poole et al. (2007), "Novel gradient coils designed using a boundary element method" Concepts Magn. Reson., 31B: 162-175. doi: 10.1002/cmr.b.20091, http://onlinelibrary.wiley.com/doi/10.1 002/cmr.b.20091/abstract *Whole document*.

Written Opinion dated Aug. 28, 2015 for International Patent Application No. PCT/CA2014/000874.

International Search Report dated Aug. 28, 2015 for International Patent Application No. PCT/CA2014/000874.

International Preliminary Report on Patentability and Written Opinion of the International Searching Authority dated Jun. 14, 2017 for PCT International Application No. PCT/CA2014/000874.

JPO, Notice of Reasons for Refusal, dated Aug. 16, 2018, re Japanese Patent Application No. 2017-530335.

You, Xiao Fei, et al. "Asymmetric gradient coil design by numerical approach for MRI brain imaging." IEEE Transactions on Applied Superconductivity 22.3 (2011): 4401904-4401904.

Poole, Michael, et al. "Simulation of Gradient-Coil-Induced Eddy Currents and Their Effects on a Head-Only HTS MRI Magnet." IEEE Transactions on Applied Superconductivity 6.21 (2011): 3592-3598.

Poole, M. S., H. Sanchez Lopez, and S. Crozier. "Eigenmode Analysis of Eddy Currents and Eigenmode Coil Design." Proc. Intl. Soc. Mag. Reson. Med. vol. 18. 2010.

Sanchez Lopez, Hector, et al. "Can we re-design the gradient coil to make the eddy current field match the primary gradient field?." ISMRM Med. 18 (2010).

Sanchez, Hector, et al. "Modal analysis of currents induced by magnetic resonance imaging gradient coils." IEEE Transactions on Magnetics 50.2 (2014).

Edler, Karl, and David Hoult. "Spherical harmonic inductive detection coils for dynamic pre-emphasis." Magnetic Resonance in Medicine: An Official Journal of the International Society for Magnetic Resonance in Medicine 60.2 (2008): 277-287.

Eccles, Craig D., et al. "Temporal spherical-harmonic expansion and compensation of eddy-current fields produced by gradient pulses." Journal of Magnetic Resonance, Series A 103.2 (1993): 135-141.

Jehenson, P., M. Westphal, and N. Schuff. "Analytical method for the compensation of eddy-current effects induced by pulsed magnetic field gradients in NMR systems." Journal of Magnetic Resonance (1969) 90.2 (1990): 264-278.

Van Vaals, J. J., and A. H. Bergman. "Optimization of eddy-current compensation." Journal of Magnetic Resonance (1969) 90.1 (1990): 52-70.

CNIPA, Third Office Action (with English Translation), dated Nov. 5, 2019 re Chinese Patent Application No. 2014800843481.

\* cited by examiner

SYSTEM AND METHOD FOR ELECTROMAGNET COIL CONSTRUCTION AND OPERATION

CROSS REFERENCE TO RELATED APPLICATIONS

This application is a continuation of U.S. patent application Ser. No. 14/894,212 filed Nov. 25, 2015, which is a 371 of International Patent Application No. PCT/CA2014/000874 filed Dec. 9, 2014. The content of these patent applications is hereby expressly incorporated by reference into the detailed description hereof.

FIELD OF THE INVENTION

The present invention relates generally to magnetic resonance imaging. More specifically, the present invention relates to the construction and operation of electromagnetic coils.

BACKGROUND OF THE INVENTION

Magnetic resonance imaging (MRI) is a major imaging technique used in medicine. MRI is capable of generating detailed images of soft tissues such as the brain, muscles and kidneys. Specific properties of the various compounds found inside tissues, such as water and/or fat, are used to generate images. When subjected to a strong magnetic field, the vector sum of the nuclear magnetic moments of a large number of atoms possessing a nuclear spin angular momentum, such as hydrogen, which is abundant in water and fat, will produce a net magnetic moment in alignment with the externally applied field. The resultant net magnetic moment can furthermore precess with a well-defined frequency that is proportional to the applied magnetic field. After excitation by radio frequency pulses, the net magnetization will generate a signal that can be detected.

Various electromagnets are integral parts of an MRI system. They allow the generation of the main magnetic field, the spatial encoding of the detected signals for the formation of spatial images, and correction of any irregularities. Electromagnets perform this function by generating magnetic fields with predetermined shapes. For example, the main magnet is designed to generate a magnetic field that is as uniform as possible, across all dimensions. Gradient coils on the other hand are designed to generate magnetic fields that vary linearly with a constant tangent along the three perpendicular axis of the MRI systems' imaging volume.

Manufacturing electromagnets which can generate magnetic fields with the desired requirements such as magnetic field shapes can present challenges. Specifically, to function properly, electromagnets are typically produced to operate in accordance with additional requirements besides magnetic field shape. For example, it is desirable to produce gradient coils, which when energized produce minimal eddy fields. This requirement is in addition to the linearity of the magnetic field produced. However, when the gradient coils are asymmetric in the longitudinal direction (z), for example, eddy fields and net torque and force can be generated which can disrupt the operation of an MRI system. Thus, improved electro-magnet manufacturing and operating techniques are needed to allow the construction of electro-magnets that better meet desired requirements while being able to generate magnetic fields that correspond to a desired field shape.

SUMMARY OF THE INVENTION

It is an object to provide a novel system and method for an MRI scanning system and method that obviates and mitigates at least one of the above-identified disadvantages of the prior art.

According to one aspect, a method of manufacturing electromagnet coils for use in a magnetic resonance imaging (MRI) system is provided. The method comprises forming a coil representation of a coil surface for the electromagnet coils; setting a plurality of performance metric requirements for a plurality of performance metrics for the electromagnet coils, the plurality of performance metrics including a magnetic field-shape metric and an eddy-field metric; forming a performance functional, based on the coil representation and the plurality of performance metrics, for generating a current density pattern over the coil surface; optimizing the performance functional based on the plurality of performance metric requirements; generating a current density pattern over the coil surface based on the minimized performance functional; and obtaining coil windings from the current density pattern.

These, together with other aspects and advantages which will be subsequently apparent, reside in the details of construction and operation as more fully hereinafter described and claimed, reference being had to the accompanying drawings forming a part hereof, wherein like numerals refer to like parts throughout.

DETAILED DESCRIPTION

Figure 1:
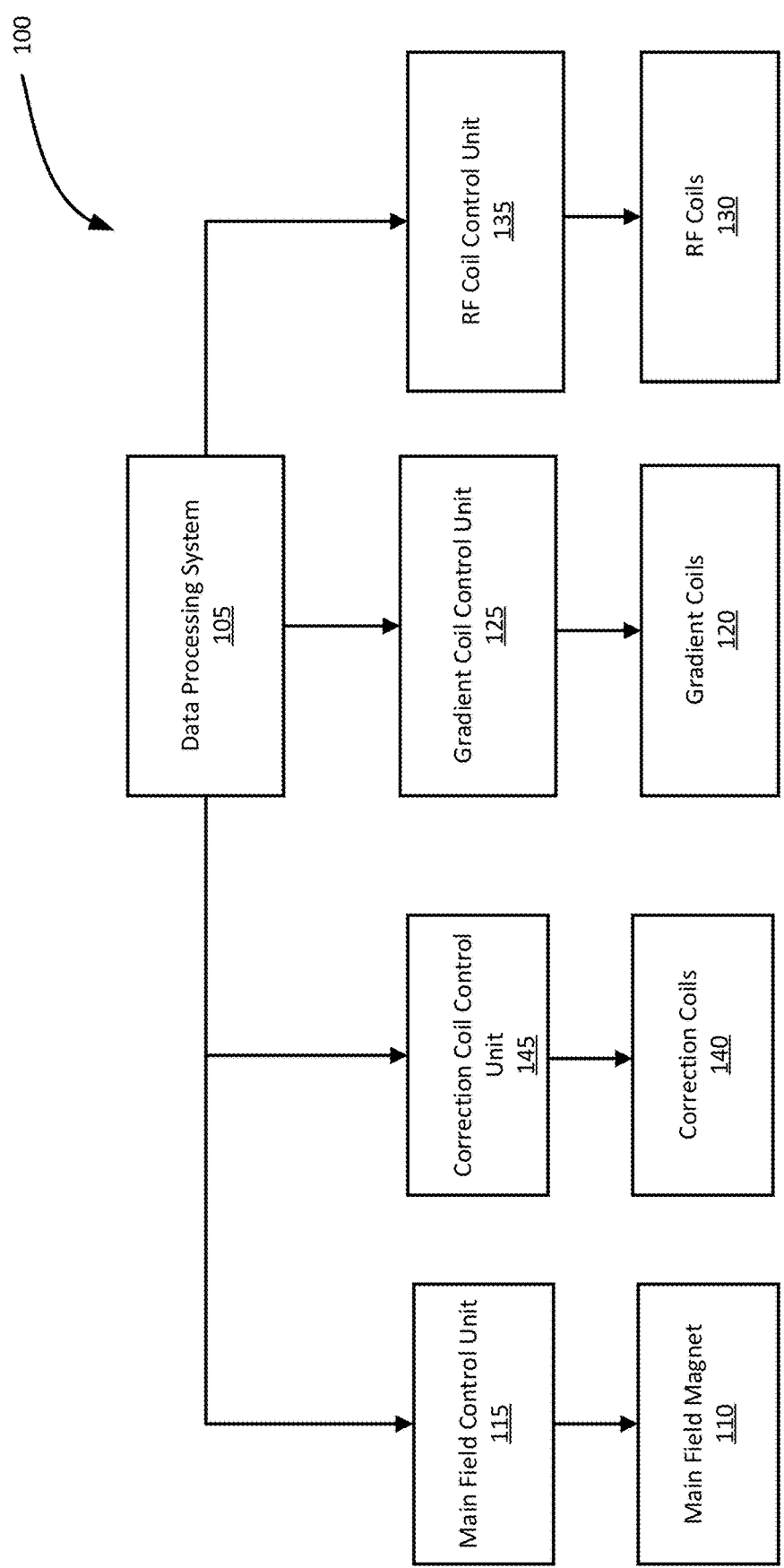
FIG. 1 shows a block diagram of functional subsystems of a magnetic resonance imaging system in accordance with an implementation.

Referring to FIG. 1, a block diagram of a magnetic resonance imaging (MRI) system, in accordance with an example implementation, is shown at 100. The example implementation of the MRI system indicated at 100 is for illustrative purposes only, and variations including additional, fewer and/or varied components are possible. Traditional magnetic resonance imaging (MRI) systems represent an imaging modality which is primarily used to construct pictures of magnetic resonance (MR) signals from protons such as hydrogen atoms in an object. In medical MRI, typical signals of interest are MR signals from water and fat, the major hydrogen containing components of tissues.

As shown in FIG. 1, the illustrative MRI system 100 comprises a data processing system 105. The data processing system 105 can generally include one or more output devices such as a display, one or more input devices such as a keyboard and a mouse as well as one or more processors connected to a memory having volatile and persistent components. The data processing system 105 can further comprise one or more interfaces adapted for communication and data exchange with the hardware components of MRI system 100 used for performing a scan.

Continuing with FIG. 1, the example MRI system 100 can also include a main field magnet 110. The main field magnet 110 can be implemented as a permanent, superconducting or a resistive magnet, for example. Other magnet types, including hybrid magnets suitable for use in the MRI system 100 will now occur to a person of skill and are contemplated. The main field magnet 110 is operable to produce a substantially uniform main magnetic field having a strength B0 and a direction along an axis. The main magnetic field is used to create an imaging volume within which desired atomic nuclei, such as the protons in Hydrogen within water and fat, of an object are magnetically aligned in preparation for a scan. In some implementations, as in this example implementation, a main field control unit 115 in communication with data processing system 105 can be used for controlling the operation of the main field magnet 110.

The MRI system 100 can further include gradient coils, for example gradient coils 120 used for encoding spatial information in the main magnetic field along, for example, three perpendicular gradient axes. The size and configuration of the gradient coils 120 can be such that they produce a controlled and uniform linear gradient. For example, three paired orthogonal current-carrying primary coils located within the main field magnet 110 can be constructed to produce desired linear-gradient magnetic fields.

In some implementations, the gradient coils 120 may be shielded and include an outer layer of shield magnets, for example coils, which can produce a counter magnetic field to counter the gradient magnetic field produced by the primary gradient coils forming a primary-shield coils pair. In such a coil pair the "primary" coils can be responsible for creating the gradient field and the "shield" coils can be responsible for reducing the stray field of the primary coil outside a certain volume such as those external to the gradient coils 120. The primary-shield coils pair of the gradient coils 120, the primary and shield coils, may be connected in series. It is also possible to have more than two layers of coils for any given gradient axis that together form shielded gradient coils 120. The shielded gradient coils 120 may reduce eddy currents and other interference which can cause artefacts in the scanned images. Since eddy currents mainly flow in conducting components of the MRI system 100 and are caused by time-varying magnetic fields external to the gradient coils 120 (leakage fields), reducing the leakage fields produced by the gradient coils 120 may reduce interference. Accordingly, the shapes and sizes, conductor wire patterns and sizes, and current amplitudes and patterns of the primary-shield coils pair can be selected so that the net magnetic field outside the gradient coils 120 is as close to zero as possible. For cylindrical magnets, for example, the two coils can be arranged in the form of concentric cylinders whereas for vertical field magnets, the two coils may be arranged in coaxial disks.

One side effect of shielding can be that the fields produced by the primary-shield coils pair of the gradient coils 120 may partially cancel each other within the imaging volume. Accordingly, more current can be required to produce a gradient field with a particular strength by shielded gradient coils 120 than by unshielded gradient coils 120. This effect can be quantified as the gradient efficiency, which may be defined as the achievable gradient strength for 1 Ampere of driving current. Another important parameter describing gradient coil performance is called the gradient slew rate, which is the rate of driving a gradient coil from zero to its maximum amplitude. The maximum achievable slew rate is lower in gradient coils with greater inductance when driven with the same power amplifier. Typically, in order to increase the efficiency of a shielded gradient coils 120 to be comparable to the efficiency of an unshielded gradient coils 120 the inductance must increase. This increase in inductance will decrease the maximum achievable slew rate. The loss in efficiency for a shielded configuration can depend on the distance and current density ratio between the primary and shield coils. Increasing the distance between the primary-shield coils pair may increase the efficiency.

The conductive components of the gradient coils 120, whether shielded or unshielded and including the primary and shield coils, may consist of an electrical conductor (for example copper, aluminum, etc.). The internal electrical connections can be such that when a voltage difference is applied to the terminals of the gradient coils 120, electric current can flow in the desired path. The conductive components for the three gradient axes for both the primary gradient coils and the gradient shield coils can be insulated by physical separation and/or a non-conductive barrier. The primary gradient windings can be placed on a non-conductive substrate (for example, G10, FR4, epoxy or others).

In some variations, the gradient coils 120 may also be provided with thermal control or heat extraction mechanisms. For example, some of the windings can be hollow and coolant can be passed through these hollow conductors to extract heat from the gradient coils 120, produced, for instance, by resistive heating of the windings when electricity is applied. Alternatively, other methods of extracting heat can be used, such as inserting coolant channels within the gradient coils 120. The coolant channels can be in thermal contact with the gradient coil windings. The gradient coils 120 can also be mounted in a thermally-conductive but electrically-non-conductive epoxy to ensure that the mechanical assembly is rigid and to limit the possibility of electrical breakdown.

The magnetic fields produced by the gradient coils 120, in combination and/or sequentially, can be superimposed on the main magnetic field such that selective spatial excitation of objects within the imaging volume can occur. In addition to allowing spatial excitation, the gradient coils 120 can attach spatially specific frequency and phase information to the atomic nuclei placed within the imaging volume, allowing the resultant MR signal to be reconstructed into a useful image. A gradient coil control unit 125 in communication with the data processing system 105 can be used to control the operation of the gradient coils 120.

In some implementations of the MRI system 100, there may be additional electromagnet coils present, such as correction coils 140. The correction coils 140, which can include shim coils, a uniform field offset coil and any other corrective electromagnets, traditionally produce (but are not limited to) magnetic field profiles of 2nd order or higher spherical harmonics or uniform magnetic fields. To perform active correction or shimming (correcting the field distortions that are introduced when different objects are placed within or around the system), the corrective electromagnets, such as the correction coils 140, carry a current that is used to provide magnetic fields that act to make the main magnetic field more uniform. For example, the fields produced by these coils can aid in the correction of inhomogeneities in the main magnetic field due to imperfections in the main magnet 110, or to the presence of external ferromagnetic objects, or due to susceptibility differences of materials within the imaging region, or any other static or time-varying phenomena. A correction coil control unit 140 in communication with the data processing system 105 can be used to control the operation of the shim coils 140.

The MRI system 100 can further comprise radio frequency (RF) coils 130. The RF coils 130 are used to establish an RF magnetic field with a strength B1 to excite the atomic nuclei or "spins". The RF coils 130 can also detect signals emitted from the "relaxing" spins within the object being imaged. Accordingly, the RF coils 130 can be in the form of separate transmit and receive coils or a combined transmit and receive coil with a switching mechanism for switching between transmit and receive modes.

The RF coils 130 can be implemented as surface coils, which are typically receive only coils and/or volume coils which can be receive and transmit coils. The RF coils 130 can be integrated near the main field magnet 110 bore. Alternatively, the RF coils 130 can be implemented in closer proximity to the object to be scanned, such as a head, and can take a shape that approximates the shape of the object, such as a close-fitting helmet. An RF coil control unit 135 in communication with the data processing system 100 can be used to control the operation of the RF coils 130.

There are many techniques for obtaining images using the MRI system 100, including T1 and T2 weighted images. To provide a simplified illustration of the MRI system 100's functionality, simplified operations for obtaining proton density-weighted images are described as a non-limiting example. To create an image in accordance with the example illustration, the MRI system 100 detects the presence of atomic nuclei containing spin angular momentum in an object, such as those of Hydrogen protons in water or fat found in tissues, by subjecting the object to a relatively large magnetic field. In this example implementation, the main magnetic field has a strength of B0 and the atomic nuclei containing spin angular momentum may be Hydrogen protons or simply protons. The main magnetic field partially polarizes the Hydrogen protons in the object placed in the imaging volume of the main magnet 110. The protons are then excited with appropriately tuned RF radiation, forming an RF magnetic field with a strength of B1, for example. Finally, weak RF radiation signal from the excited protons is detected as an MR signal, as the protons "relax" from the magnetic interaction. The frequency of the detected MR signal is proportional to the magnetic field to which they are subjected. Cross-sections of the object from which to obtain signals can be selected by producing a magnetic field gradient across the object so that magnetic field values of the main magnetic field can be varied along various locations in the object. Given that the signal frequency is proportional to the varied magnetic field created, the variations allow assigning a particular signal frequency and phase to a location in the object. Accordingly, sufficient information can be found in the obtained MR signals to construct a map of the object in terms of proton presence, which is the basis of a traditional MRI image. For example, since proton density varies with the type of tissue, tissue variations can be mapped as image contrast variations after the obtained signals are processed.

Figure 2:
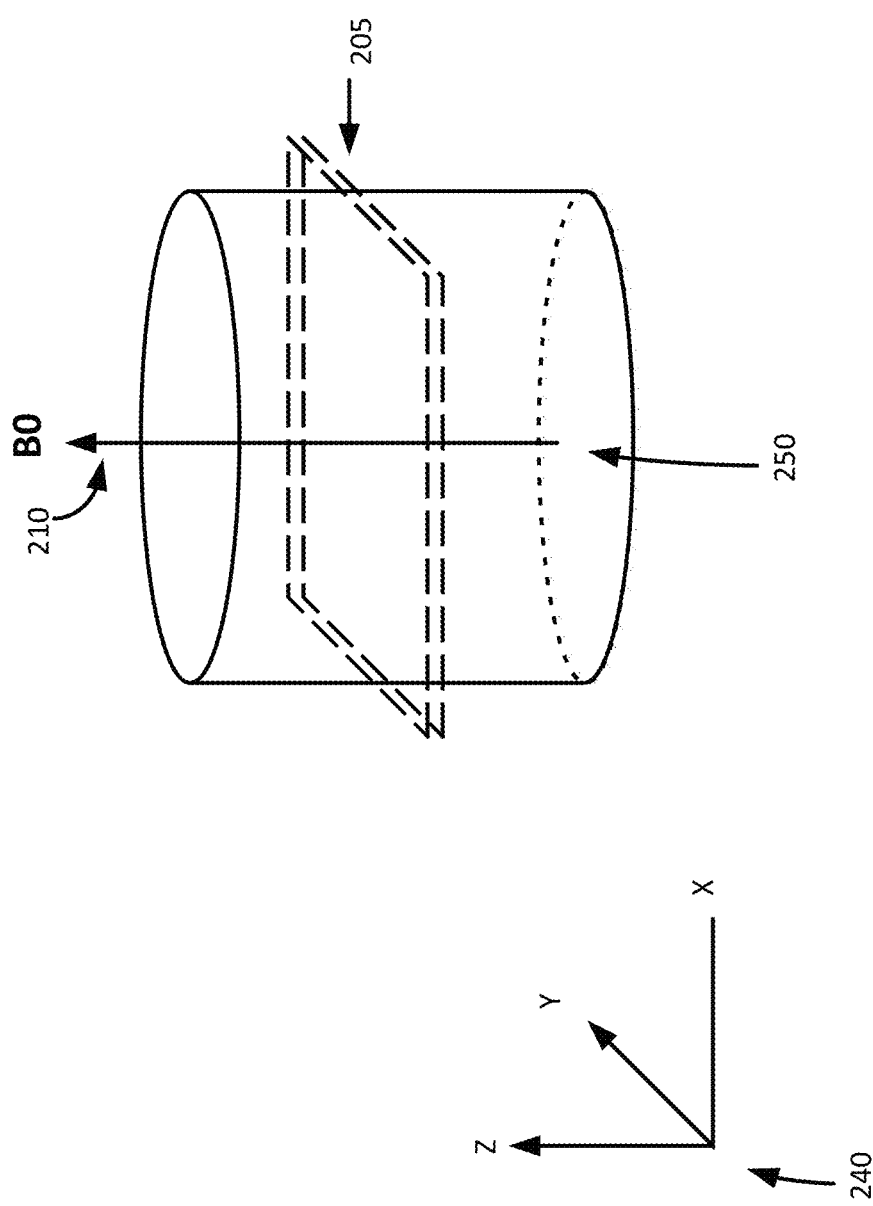
FIG. 2 shows an imaging volume and corresponding slice to be scanned by the magnetic resonance system of FIG. 1 in accordance with an implementation.

Referring now to FIG. 2, to further illustrate the example signal acquisition process by the MRI system 100, it will be assumed that an object is placed within an imaging volume 250 of the main magnet 110 having a main magnetic field 210 with a strength B0, pointing along the Z-axis indicated at 240. The object subsequently has a net magnetization vector. In this illustrative example, a slice in a plane along the X and Y axes, as indicated at 205, is being imaged. It should be noted that in this example, the slice has a finite thickness along the Z-axis, creating a volumetric slice 205. To obtain images from the MRI system 100 in the traditional manner, one or more sets of RF pulses and gradient waveforms (collectively called "pulse sequences") are selected at the data processing system 105. The data processing system 105 passes the selected pulse sequence information to the RF control unit 135 and the gradient control unit 125, which collectively generate the associated waveforms and timings for providing a sequence of pulses to perform a scan.

The sequence of RF pulses and gradient waveforms, namely the type of pulse sequence, applied may change which relaxation times have the most influence on the image characteristics. For example, T2* relaxation has a significant influence following a 90° RF pulse which is used in a gradient-echo (GRE) sequence, whereas T2 relaxation has a more significant influence following 90°-180° sequential RF pulses (also known as a spin echo sequence).

Figure 3:
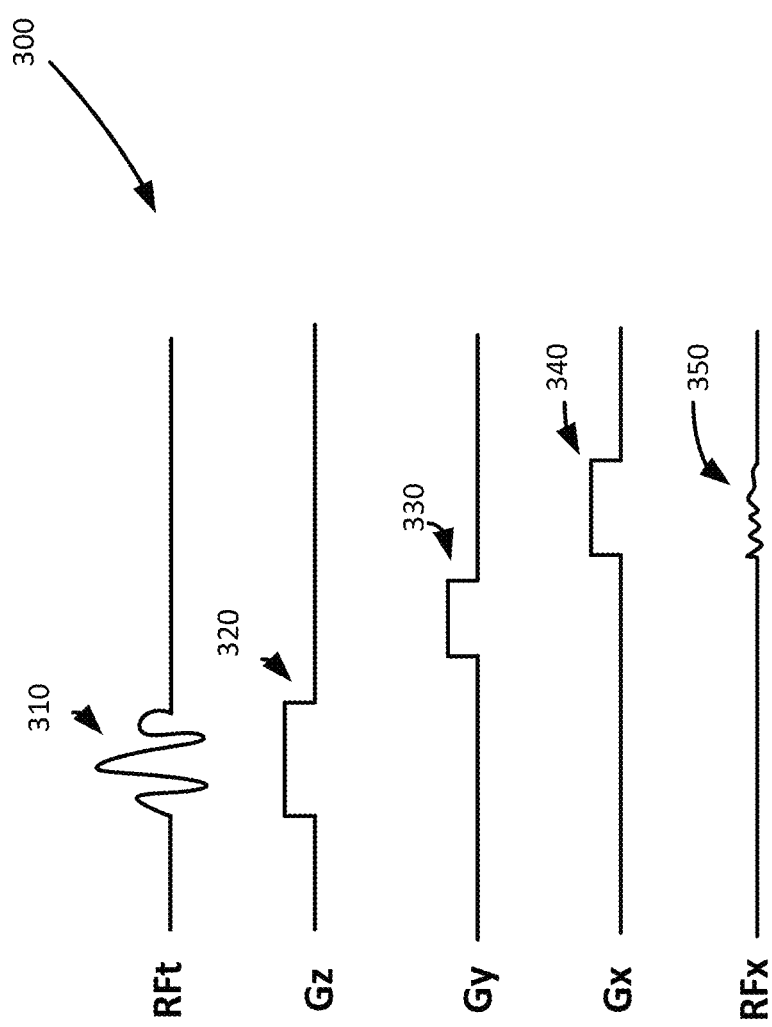
FIG. 3 shows an example pulse sequence in accordance with an implementation.

Referring now to FIG. 3, an illustrative pulse sequence 300 is shown that can be used to acquire images using the MRI system 100. Specifically, a timing diagram for the example pulse sequence is indicated. The timing diagram shows pulse or signal magnitudes, as a function of time, for the transmitted (RFt) signal, the magnetic field gradients $G_x$, $G_y$, and $G_z$, and the received RFx signal. An idealized pulse sequence, simplified for illustrative purposes, can contain a slice selection radio frequency pulse 310 at RFt, a slice selection gradient pulse 320 at Gz, a phase encoding gradient pulse 330 at Gy, a frequency encoding gradient pulse 340 at Gx, as well as a detected MR signal 350 at RFx. The pulses for the three gradients Gx, Gy, and Gz represent the magnitude and the duration of the magnetic field gradients that can be generated by the gradient coils 120. The slice selection pulse 310 can be generated by the transmit aspect of RF coils 130. The detected MR signal 350 can be detected by the receive aspect of the RF coils 130. In this illustrative example it will be assumed that the transmit aspect and the receive aspect of the RF coils 130 are formed by distinct coils.

The first event to occur in pulse sequence 300 can be to turn on the slice selection gradient pulse 320. The slice selection RF pulse 310 can be applied at the same time. In this illustrative example, the slice selection RF pulse 310 can be a sinc function shaped burst of RF energy. In other implementations, other RF pulse shapes and durations can be used. Once the slice selection RF pulse 310 is turned off, the slice selection gradient pulse 320 can also be turned off and a phase encoding gradient pulse 330 can be turned on. Once the phase encoding gradient pulse 330 is turned off, the frequency encoding gradient pulse 340 can be turned on and the detected MR signal 350 can be recorded. It should be noted that the shapes, magnitudes, ordering and durations of the pulses and signals shown in FIG. 3 are chosen for illustrative purposes, and that in implementations, one or more of these factors and others may be varied to achieve the desired scan results.

The pulse sequence 300 can be repeated a certain number of times or iterations, for example 256 times, to collect all the data needed to produce one image. The time between each repetition of the pulse sequence 300 can be referred to as the repetition time (TR). Moreover, the duration between the center point of the slice selection pulse 310 and the peak of detected MR signal 350 can be referred to as echo time (TE). Both the TR and the TE can be varied as appropriate for a desired scan.

To further illustrate the signal acquisition process of MRI system 100, FIG. 2 is referred to in conjunction with FIG. 3. To select a slice, the slice selection gradient pulse 320 can be applied along the Z-axis, satisfying the resonance condition for the protons located in the slice 205. Indeed, the location of the slice along the Z-axis can be determined based in part on the slice selective gradient pulse 320. Accordingly, the slice selection pulse 310, generated at the same time as the slice selection gradient pulse 320 can excite protons that are located within the slice 205 in this example. Protons located above and below the slice 205 are typically not affected by the slice selection pulse 310.

Continuing with the illustrative example, in accordance with the pulse sequence 300, a phase encoding gradient pulse 330 can be applied after the slice selection gradient pulse 320. Assuming this is applied along the Y-axis, the spins at different locations along the Y-axis can begin to precess at different Larmor frequencies. When the phase encoding gradient pulse 330 is turned off, the net magnetization vectors at different locations can precess at the same rate, but possess different phases. The phases can be determined by the duration and magnitude of the phase encoding gradient pulse 330.

Once the phase encoding gradient pulse 330 is turned off, a frequency encoding gradient pulse 340 can be turned on. In this example the frequency encoding gradient is in the X direction. The frequency encoding gradient can cause protons in the selected slice to precess at rates dependent on their X location. Accordingly, different spatial locations within the slice are now characterized by unique phase angles and precessional frequencies. RF receive coils 130 can be used to receive the detected signal 350 generated by the protons contained in the object being scanned while the frequency encoding gradient pulse 340 is turned on.

Figure 4:
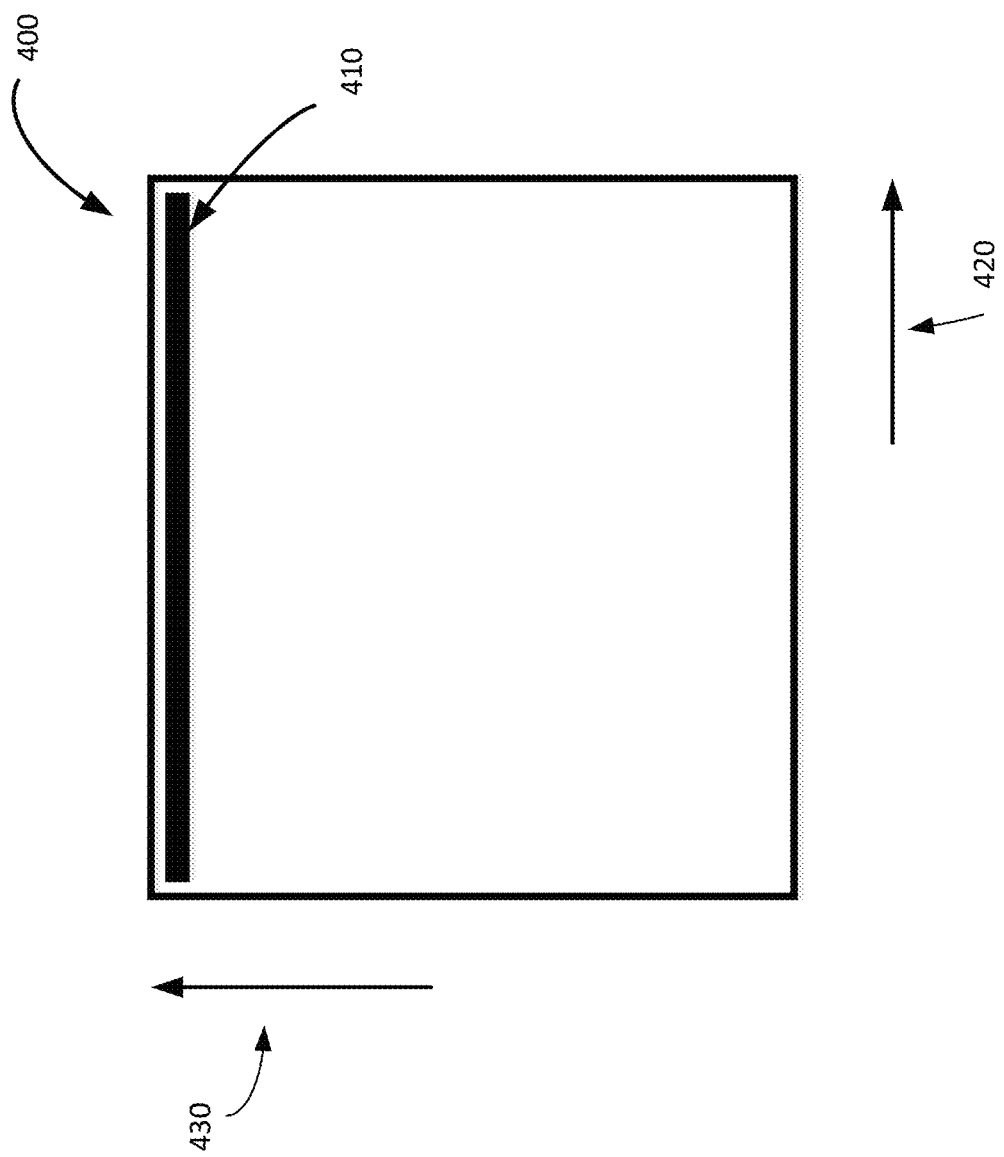
FIG. 4 shows a schematic representation of a k-space containing one received line in accordance with an implementation.

As the pulse sequence 300 is performed by the MRI system 100, the acquired signals can be stored in a temporary matrix referred to as the k-space, as shown in FIG. 4 at 400. Typically, the k-space is the collection of the detected signals measured for a scan and is in the spatial frequency domain. The k-space can be covered by frequency encoding data along the X-axis 420 (Kx) and phase encoding data along the Y-axis 430 (Ky). When all of the lines for the k-space matrix for a slice are received (at the end of the scan of a single slice, for example) the data can be mathematically processed, for example through a two-dimensional Fourier-transform, to produce a final image. Thus, the k-space can hold raw data before reconstruction of the image into the spatial domain. Typically, the k-space has the same number of rows and columns as the final image and is filled with raw data during the scan, usually one line per pulse sequence 300. For example, the first line of the k-space 400, indicated at 410, is filled after the completion of the first iteration of the pulse sequence generated for scanning a slice and contains the detected signal for that pulse sequence iteration. After multiple iterations of the pulse sequence, the k-space can be filled. Each iteration of the pulse sequence may be varied slightly, so that signals for the appropriate portions of the k-space are acquired. It should be noted that based on different pulse sequences, other methods of filling the k-space are possible, such as in a spiral manner, and are contemplated.

The gradient coils 120 produce time-varying magnetic fields with a specific spatial distribution and are a typical component of MRI systems. Greater field-variation magnitudes enable faster MR imaging sequences and increased resolution. As discussed above, the maximum achievable gradient strength is characterized by the gradient efficiency. The efficiency of the gradient coils 120 can be improved through variations in the shape, size and placement of the gradient coils 120. For example, in a cylindrical implementation the primary gradient coil windings may be built at a smaller radius closer to the object in the imaging volume. Alternatively, the number of wires (winding density) can be increased.

The gradient coils 120 can have a high degree of symmetry when, for example, the object to be imaged is located at the center of the coils. Accordingly, such coils are typically referred to as symmetric gradient coils. Due to physical and geometrical constraints, for some MRI systems 100, the objects to be imaged may not be located symmetrically at the center of the gradient coils 120. Further, such coils may not even be symmetric in shape. For example, a head gradient coil may fit the head, but not the shoulders. Alternatively, there may be slots for shoulders with the coil extending above the chest and underneath the back. Coils of this type are typically known as asymmetric gradient coils.

Figure 5:
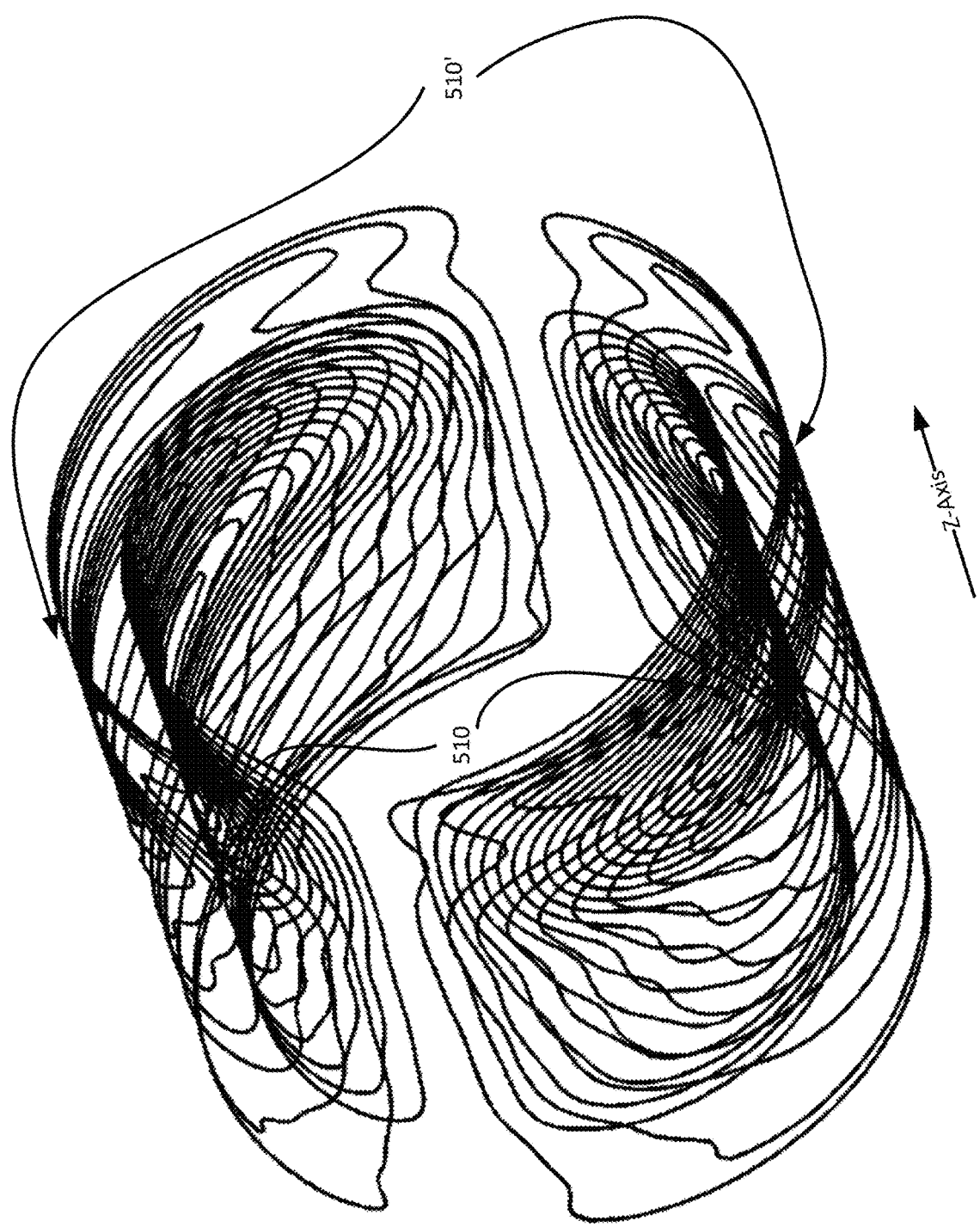
FIG. 5 shows a gradient coil wire pattern that is asymmetric along the longitudinal direction with one spiral per layer in accordance with an implementation.

When the gradient coils 120 are constructed, certain performance metrics can be considered. For example, the gradient coils 120 are typically constructed so as to reduce net force and torque experienced when they are energized. Net force can be characterized in each of the x, y and z directions in terms of Newtons per Ampere of current and this quantity determines the tendency for the coil to translate in space when energized. Net torque can be characterized in each of the x, y and z directions in terms of Newtons per meter per Ampere and this quantity determines the tendency for the coil to rotate when energized. Achieving force- and torque-balance is a particularly challenging problem for gradient coils 120 that are asymmetric along the longitudinal (z) dimension. For example, as shown in FIG. 5, gradient coils that are asymmetric along the longitudinal direction can have wire patterns with single spirals 510 (hereafter referred to as 'thumbprint' 510) for each side of the coil, an arrangement that can enable increased efficiency. In this example, two additional thumbprints 510' are shown which are the portions of the shield coil corresponding to the primary coil.

The gradient coils 120 are typically designed and constructed to lower net force and torque from such asymmetric designs. For example, in some variations, a shield coil can be used to cancel the torque of a primary coil when the two coils are part of the same rigid mechanical assembly. When the primary and the shield coil wire patterns form part of the same rigid mechanism, it is possible to get torque-balanced implementations by using a single thumbprint for the primary coil and a single thumbprint for the shield coil, although it can also be possible to achieve torque-balanced implementations for other patterns and numbers of thumbprints. Other considerations such as wire density and pattern can also be used to reduce net torque and force. The reduction in net torque and force experienced is made in consideration of other performance metrics limits. Thus, in some implementations, optimum force and torque-balance may be sacrificed to achieve requirements set for other performance metrics.

Efficiency is another performance metric to be considered when constructing the gradient coils 120. Efficiency can be defined as the gradient strength per unit current driven through the gradient coils 120. High efficiency aids the production of large gradient amplitudes, which in turn can allow the acquisition of higher resolution images or reduce scan times for example. Efficiency is linearly proportional to the winding density of the gradient coils 120. For example, when the winding density is doubled, the efficiency typically doubles as well. Accordingly, the gradient coils 120 are typically constructed with as high an efficiency as possible, in light of other performance metrics, including requirements set for other performance metrics. Thus, in some implementations, optimum efficiency may be sacrificed to achieve requirements set for other performance metrics. For example, a particular winding density can be chosen to obtain a desired efficiency that may be lower than the highest possible efficiency so that limits for other performance metrics can be met.

Power dissipation is yet another performance metric to be considered. Power dissipation can be determined based on power which is the resistance of the gradient coils 120 multiplied by the current squared. Accordingly, power dissipation can be a measure of the amount of heat that can be created when the gradient coils 120 are energized. Power dissipation is proportional to the square of the winding density. For example, when the winding density is doubled, the power dissipation typically quadruples. Accordingly, the gradient coils 120 are typically constructed with as low a power dissipation (and thus heat generation) as possible, in light of other performance metric requirements set. For example, a particular winding density can be chosen to obtain a desired power dissipation that may be higher than the lowest possible power dissipation so that requirements set for other performance metrics can be met.

Energy is a further performance metric that can be considered when constructing the gradient coils 120. Energy can be defined as the inductance of the gradient coils 120 multiplied by the current squared multiplied by 0.5. This metric can be a measure of how fast the gradient coils 120 can be switched on or off. Lower energy typically implies faster switching rates. Energy, similar to power dissipation is proportional with the square of the winding density. For example, when the winding density is doubled, the energy typically quadruples. Accordingly, the gradient coils 120 are typically constructed with as low an energy (fastest switching) as possible, in light of other performance metric requirements. For example, a particular winding density can be chosen to obtain a desired energy that may be higher than the lowest possible energy so that the requirements set for other performance metrics can be met.

Gradient field-shape metric is a further performance metric. Magnetic field gradient linearity and uniformity is typically a primary consideration when implementing the gradient coils 120. Gradient field-shape metric is a measure of how well the field that the gradient coils 120 produces matches a target gradient field, which in the example MRI system 100 has a linear and uniform spatial gradient. There are many ways that this gradient metric can be defined. An example definition is the sum of the squared difference between the field that is produced by the gradient coils 120 and the target gradient field over a set of positions in a volume of interest. Based on this definition, the gradient field-shape metric is lowered, to the extent possible, in light of other performance metric requirements specified. For example, a particular winding pattern can be chosen to obtain a particular gradient linearity metric that may be higher than the lowest possible gradient linearity metric so that specified requirements for other performance metrics can be met.

Another performance metric of interest is the eddy-field metric. Eddy currents are induced on conducting surfaces other than the energized gradient coils 120, such as within the main magnet 110 bore. As discussed above, the unshielded gradient coils 120 may produce time-varying magnetic fields outside the gradient coils 120. These fields may induce eddy currents in external conducting surfaces outside of the gradient coil, such as the cylindrical main magnet 110 bore. As further discussed above, eddy currents can create undesirable time-varying magnetic fields (eddy fields) within the imaging volume and can adversely affect image quality for many imaging sequences. The magnitude of eddy field effects can be greatly reduced by the addition of gradient shield coils, which typically consist of opposite sense windings outside of the primary gradient coils.

Figure 6:
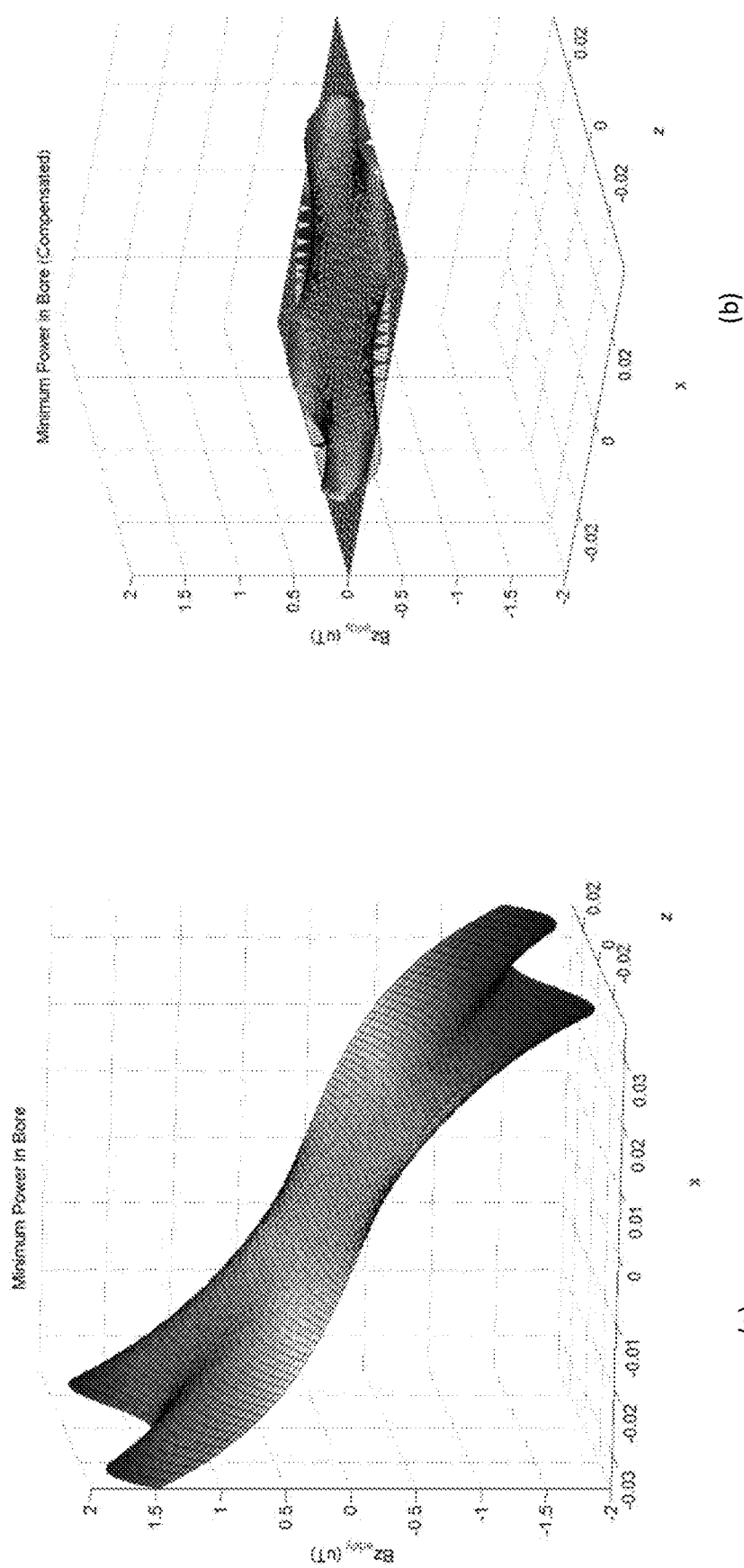
FIG. 6 shows an example linear eddy field profile (a) and its compensated form (b) in accordance with an implementation.

Although the magnitude of eddy currents induced by the shielded gradient coils 120 is substantially reduced compared to the unshielded gradient coils 120, eddy currents are not completely eliminated by the use of shield gradient coils 120. Indeed, some eddy fields remain despite the shielding. Where the gradient coils 120 are symmetric and shielded, and the conducting surface is symmetric with respect to the gradient coil, the spatial field profile of the eddy fields typically match the spatial field profile of the magnetic field generated by gradient coils 120. Namely, they may have substantially spatially linear profiles, as shown in FIG. 6(a) for example. The eddy fields may thus be compensated for by minor adjustments to the current waveform sent through the gradient coils 120 as shown in FIG. 6(b).

Figure 7:
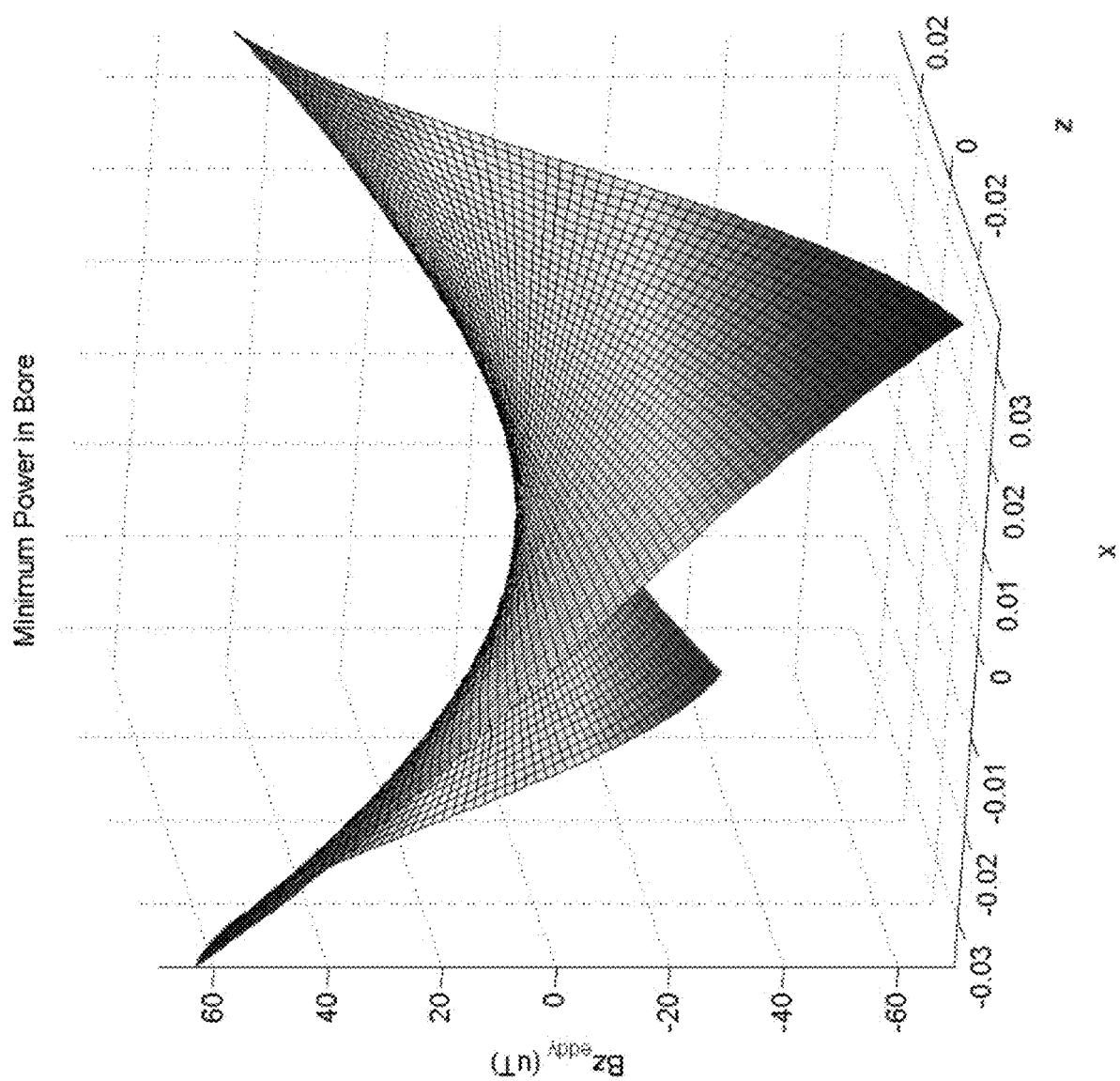
FIG. 7 shows an example non-linear eddy field profile in accordance with an implementation.

In the case of asymmetric shielded gradient coils 120, the spatial field profile of the remaining eddy fields may not match the spatial field profile of the magnetic field generated by gradient coils 120. Namely, they can have non-linear spatial profiles as shown in FIG. 7. Accordingly, the remaining eddy fields cannot be readily reduced by modifying the current waveform sent through the gradient coils 120.

Implementing the gradient coils 120 so that they produce constrained eddy fields can enable the use of asymmetric gradient coils 120 for advanced imaging techniques. In some implementations, constraining of eddy fields can be achieved on the basis of the gradient coils 120 design. For example, the design of the asymmetric and shielded gradient coils 120 can be implemented such that the remaining eddy fields match the spatial profile of the gradient fields (for example, can be spatially linear) generated by the gradient coils 120. Alternatively, or in addition, the design of the gradient coils 120 can enable the eddy fields to be constrained such that they can be actively compensated for. For example, asymmetric gradient coils 120 can be implemented to produce eddy fields that can be represented by the desired set of the gradient coils 120 and the correction coils 140. For example, constrained eddy fields caused by the gradient coils 120 can be controlled dynamically through the correction coils 140, during the operation of the gradient coils 120.

There are many ways that the eddy-field metric can be defined. An example definition is the sum of the squared difference between the eddy-field that is produced by the gradient coils 120 and the target eddy-field, which represent the desired constraints on the eddy-field, over a set of points on the volume of a region of interest. Based on this definition, the eddy-field metric is lowered, to the extent possible, in light of other performance metric requirements specified. For example, a particular winding pattern can be chosen to obtain a particular eddy-field metric that may be higher than the lowest possible eddy-field metric so that specified requirements for other performance metrics can be met. It is to be understood by those of skill that other similar eddy-field metric definitions and minimizations can be used, such as minimizing the eddy-current density over a known conducting surface.

Figure 8:
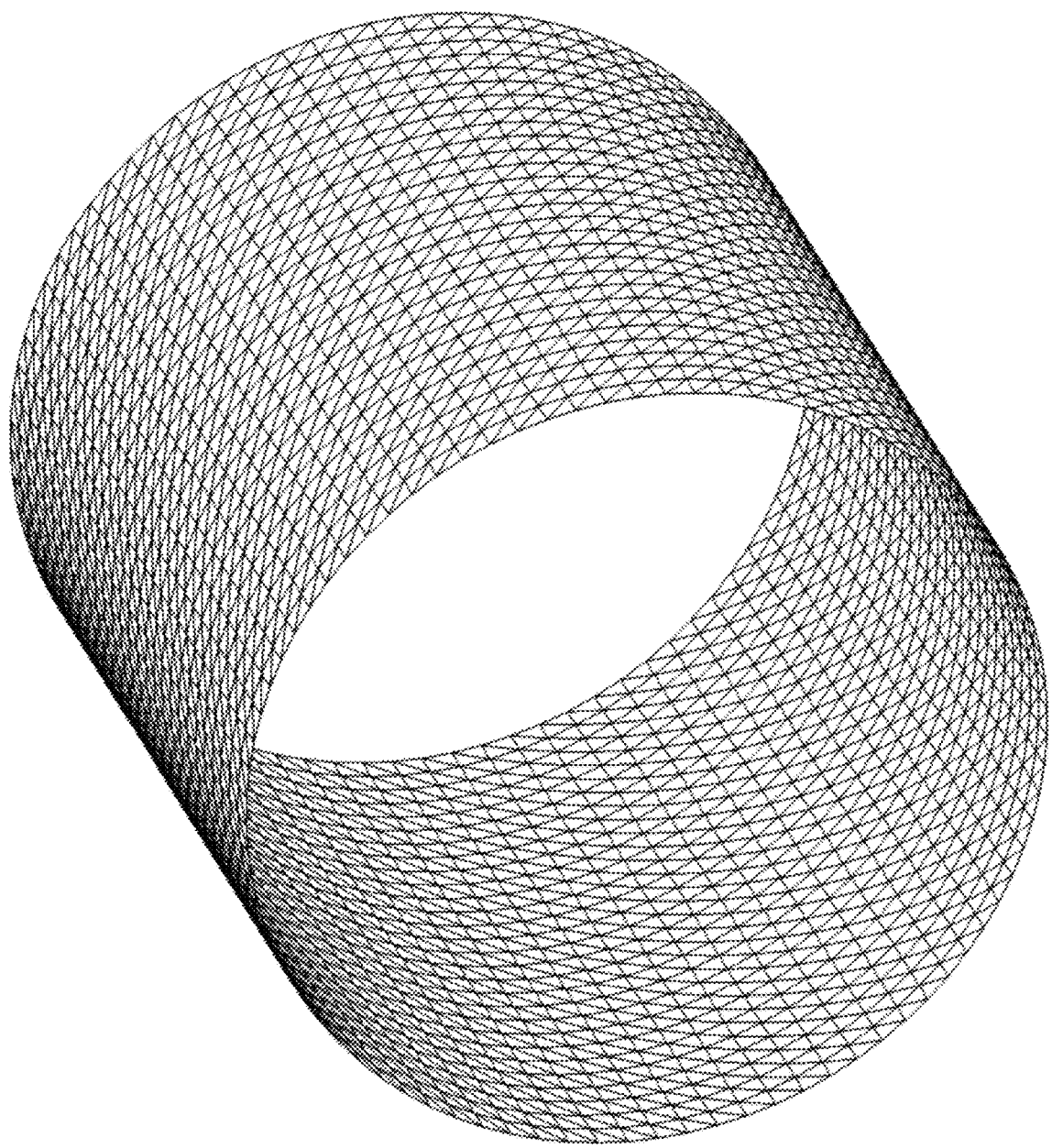
FIG. 8 shows an example digitized cylindrical surface in accordance with an implementation.

To achieve the performance metric limits associated with different performance metric requirements, a representation of the current density for the gradient coils 120 over the surface where the gradient coils 120 are to reside (for example, a cylinder) can be generated. This representation can be analytic, usually incorporating some sort of basis representation for the given geometry. For example, where the gradient coils 120 are to reside on a cylinder, cylindrical harmonics can be used as the basis representation. Alternatively, the representation can be numerical. For example, the current density for the gradient coils 120 can be based on current elements over a finite triangular mesh. In a boundary element method (BEM) approach to coil design, for example, any surface on which electrical current can flow can be approximated or represented by a collection of triangular elements that form a mesh over the whole surface. Within each element is contained information that describes the direction and magnitude of the electrical current density. A step in the BEM, accordingly, is the discretization of a surface geometry into a finite mesh composed of triangular elements. The triangular elements are hereinafter referred to as elements and the vertices of these elements are hereinafter referred to as nodes. FIG. 8 shows an example cylindrical surface onto which the gradient coils 120 are to be placed, discretized into a fine mesh composed of triangles.

In practice, in accordance with the BEM, the current density pattern over a two dimensional surface can be represented in an indirect manner in the form of a scalar stream function. The stream function can be represented as a piece-wise linear (or higher order) function over the surface geometry on which the gradient coils 120 are to be placed. The stream function can consist of a single scalar value for each node in the mesh and when all of the nodes are considered together, the stream function can be transformed to find the direction and magnitude of the current density in each triangular element.

In one implementation, a stream function, $\psi(r)$, residing within the surface of elements with corresponding current density J(r) can be defined, where r represents the position on the mesh. The stream function can be approximated by a weighted sum of basis functions for each node n as:

$$\psi(r) = \sum_{n=1}^{N} I_n \psi_n(r) \qquad \text{(equation 1.1)}$$

In equation 1.1, $I_n$ is the weighting coefficient for the basis function $\psi_n(r)$ of node n. With this approximation, the current density for the stream function can be represented as a sum of current density basis functions, defined as:

$$J(r) = \nabla \times [\psi(r)n(r)] \qquad \text{(equation 1.2)}$$

$$J(r) \approx \sum_{n=1}^{N} I_n \nabla \times [\psi_n(r)n(r)] \qquad \text{(equation 1.3)}$$

$$J(r) \approx \sum_{n=1}^{N} I_n J_n(r) \qquad \text{(equation 1.4)}$$

$$J_n(r) \approx \sum_{k=1}^{K} v_{nk} = \sum_{k=1}^{K} \frac{e_{nk}}{2A_k} \qquad \text{(equation 1.5)}$$

In equations 1.2 through 1.5, n(r) is the outward pointing normal of the surface, K is the number of triangles surrounding node n, $A_k$ is the area of triangular element k associated with node n, and $e_{nk}$ is the vector that opposes node n within triangular element k.

The current density representation (or the stream functions) can be used to produce a pattern of current density that achieves the set requirements for performance metrics such as balancing of matching magnetic field targets and having low power dissipation while at the same time satisfying specified requirements for eddy currents. For example, performance metrics that can be described by a current density, including for example, the gradient field-shape metric, dissipative power, energy, eddy currents, force and torque can be described based on various performance metric functions.

To find the stream function and corresponding current density representation that achieves the specified requirements set for performance metrics, a performance functional can be formed using the performance metrics as functions. In some implementations, the performance metric functions can include weighting parameters. In other implementations, performance metric functions may be set as constraints on the performance functional. A constraint can be set in the form of a single value (i.e. constrained to zero) or a range of values that are acceptable for that performance function. In yet further variations, the above discussed approaches to satisfying the performance metric requirements may be combined, for example some performance metrics being used to constrain the performance functional and other performance metrics including weighting parameters.

As an example of using constraints, in some implementations, the stream function for a given surface can conjointly be broken down into a linearly independent basis set of stream function modes (called eigenmodes, or just modes). Higher order modes are represented by stream functions that have a greater degree of spatial variation over shorter distances. For example, the modes can represent orthogonal spatial field variations that correspond to spherical harmonic field variations. The total stream function is then represented as a linear combination of modes. As an example, the stream function corresponding to the eddy current density induced on a conducting surface, such as the bore of the main field magnet 110, can be represented by a linear combination of modes. The eddy current stream function can be calculated through the mutual inductance of the calculated current density of the gradient coils 120 representation with the conducting surfaces of interest, such as the main magnet 110's bore.

To constrain the induced eddy currents to take on a particular magnetic field shape (for example, allowing only a mode that produces an eddy field that closely matches the spatial variation of the gradient field), a set of modes other than the desired modes (for example, higher order spherical harmonic modes) can be suppressed. The suppression can be achieved by including in the performance metric functional a constraint that the amplitude of any undesired modes be suppressed to a minimal value or zero. Accordingly, the eddy field components that cannot be compensated for can thus be eliminated. For example, for cylindrical asymmetric gradient coils, it may not be necessary to include constraints for modes that produce field variation of a higher order than approximately the 4th order in the spherical harmonic basis because the spatial variation of a normal gradient wire pattern does not typically change rapidly over short distances. For non-cylindrical gradient coils, it may be necessary to suppress higher order modes than for the cylindrical case. As a further example, when the MRI system 100 includes second order correction coils 140, third and higher order modes can be suppressed, thus enabling the shim coils 140 to compensate for the resulting eddy fields. In variations, the modes can be weighted to obtain eddy fields with desired shapes. Accordingly, any combination of zeroth, first or higher-order modes, combined in a weighted manner can be formed.

Once the performance functional is formed, it can be minimized or optimized to produce a current density pattern that achieves the specified gradient coil performance metric constraints. The minimization can be based on various techniques such as least-squares matrix inversion, analytic formulae or an iterative solver. For example, where one or more performance metric functions include weighting parameters, the competing performance metrics can be balanced simultaneously, to achieve the desired performance metric requirements such as low power dissipation and desired field shape by finding a set of parameters that minimizes the performance functional. As a further example, in implementations where one or more performance metrics are set as constrains, constrained optimization can be used to find the desired performance metric requirements. In variations, the solution of the performance functional itself can be set to be constrained to a certain desired range. If not in range, performance metrics or weighting parameters can be changed, for example, to obtain a different solution. This process can be repeated iteratively until the obtained solution is within the range of acceptable design goals. Example goals include minimum conductor separation, maximum power deposition per unit area, maximum force on a given component and others.

Figure 9:
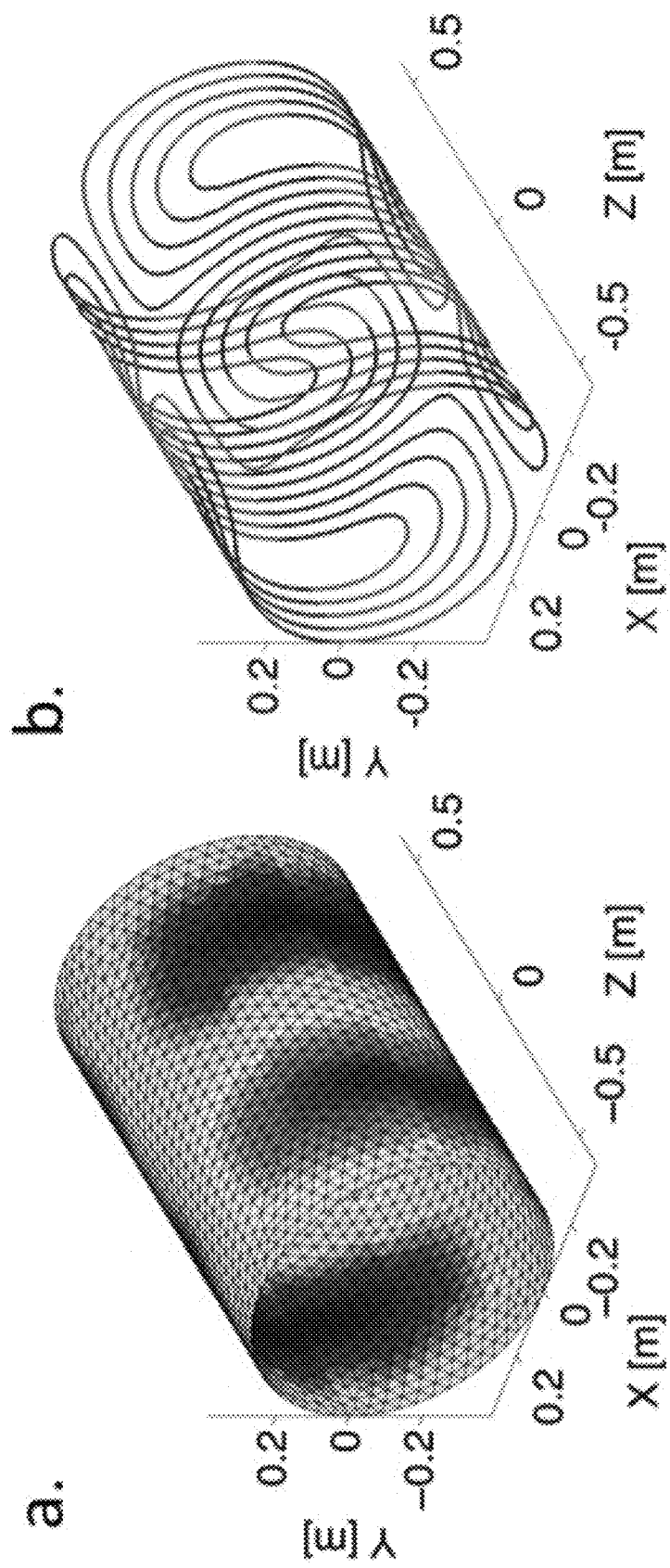
FIG. 9 shows the example digitized cylindrical surface with a stream function pattern and a corresponding coil wire pattern in accordance with an implementation.

The resulting current density pattern obtained by minimizing or optimizing the performance functional can be contoured to obtain a wire pattern, which is a discrete number of current paths that approximates the current density represented by the stream function. FIGS. 9(*a*) and 9(*b*) displays a stream function and corresponding wire pattern respectively after contouring for a transverse gradient coil implemented over a cylindrical surface. The choice of number of contours (and thus the coil wire density) can also be based on the performance metric weightings and constraints since some of the performance metric weightings and constraints may be related to wire density, for example, a constraint to enforce a certain minimum wire separation.

Using the gradient coil implementation method allows any desired surface shape to be used over which the coil can be implemented. The discretization of the stream function is dependent on the shape of the finite elements making up the mesh rather than the shape of the final surface. However, the mesh surfaces are typically non-intersecting.

Figure 10:
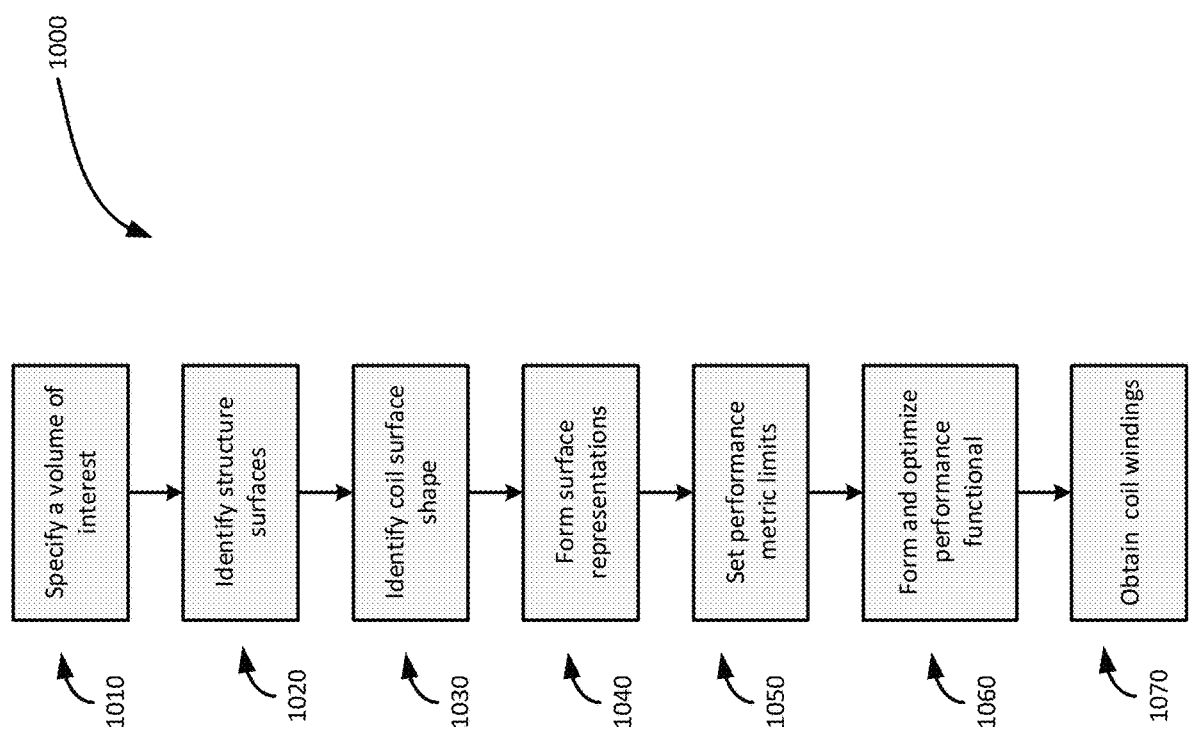
FIG. 10 shows a flowchart for a method of manufacturing gradient coils for use in the magnetic resonance imaging system of FIG. 1 in accordance with an implementation.

Referring to FIG. 10 a method of manufacturing gradient coils 120 is shown at 1000. At 1010, a volume of interest where the gradient field will be generated is chosen. This typically corresponds to a volume within the main magnet 110. At 1020, eddy field causing structure surfaces are identified, which in this example is the bore of the main magnet 110. At 1030, the shape of the surface on which the gradient coils 120 are to be placed are identified, which in this example is a cylinder within the bore of the main magnet 110. At 1040, representations of the surfaces are formed. For example, the surface and cylindrical surface are triangulated and representations formed. At 1050 performance metric set limits are identified, in this example in the form of constraints. Specifically, in this example, the two constraints are the gradient linearity metric and the eddy field metric. The target eddy-fields have the modes that produce field variations higher than second order spherical harmonics suppressed since the correction coils 140 are second order coils and cannot correct for modes higher than second order spherical harmonics. At 1060 a performance functional is formed and minimized. The performance functional in this example includes performance metric functions for the gradient linearity metric and the eddy-field metric. At 1070 the current density is computed based on the minimized performance functional and coil windings are obtained based on a contouring of the current density pattern.

In variations, the manufactured gradient coils 120 can be operated in such a manner so as to include compensation currents through the gradient coils 120 and correction coils 140 to cancel the eddy fields produced. The compensation currents can be determined by prospectively simulating and determining on the basis of the simulation the eddy current response for any pulse sequence. The simulated eddy-field profile can then be decomposed into a linear combination of the fields produced by the correction coils 140 at each time step such that the combination of currents through the gradient coils 120 and correction coils 140 produce a magnetic field in the imaging volume that cancels the eddy field to the extent possible. This can be achieved through, for example, a least-squares minimization or any other similar method. An alternative method is to measure the time and spatial variations of eddy currents for a pulse sequence and then compute the best fit electrical current waveform to pass through the correction coils 140 for compensation. The required correction current waveforms can be saved with the pulse sequence for example at the data processing system 105 and played out at the same time as the pulse sequence gradient waveforms to provide the necessary real-time compensation.

The gradient coils 120 manufactured and operated in accordance with the above described methods can be applied to any application or geometry of MRI systems. For example, in one variation the imaging region may be at the center of the gradient coils 120 and the conducting surfaces in the MRI environment may not be distributed symmetrically around the gradient coil. When the positions of the conducting surfaces are fixed and known, the gradient coil implementation method can be adjusted to produce eddy currents constrained in order to facilitate dynamic correction.

In variations, the above discussed methods can also be applied to the design, manufacture and operation of electromagnets besides gradient coils. For example, the main magnet 105 or correction coils 140 can also be manufactured in accordance with the above described processes. As a further example, field-shifting coils used in delta relaxation enhanced magnetic resonance imaging can also be designed, manufactured and operated in accordance with the above described processes.

The above-described embodiments are intended to be examples and alterations and modifications may be effected thereto, by those of skill in the art, without departing from the scope which is defined solely by the claims appended hereto. For example, methods, systems and embodiments discussed can be varied and combined, in full or in part.

We claim:

1. A method of manufacturing electromagnet coils for use in a magnetic resonance imaging (MM) system, the method comprising:
   forming a coil representation of a coil surface for the electromagnet coils;
   setting a plurality of performance metric requirements for a plurality of performance metrics for the electromagnet coils, the plurality of performance metrics including a magnetic field-shape metric and an eddy-field metric;
   forming a performance functional, based on the coil representation and the plurality of performance metrics, for generating a current density pattern over the coil surface;
   optimizing the performance functional based on the plurality of performance metric requirements;
   generating a current density pattern over the coil surface based on the minimized performance functional;
   obtaining coil windings from the current density pattern;
   wherein the MM system further comprises correction coils;
   wherein the eddy-field metric is a predetermined eddy field shape;
   wherein optimizing the performance functional further comprises constraining an eddy current density representation over an eddy-field producing structure surface such that eddy fields predicted by the eddy-current density representation conform to said predetermined eddy field shape; and
   obtaining further coil windings for said correction coils from said eddy-current density representation thereby enabling the correction coils to compensate for said eddy fields.

2. The method of claim 1 wherein said correction coils are second order correction coils and wherein the eddy current density representation is constrained by suppressing third and higher order modes.

3. The method of claim 2 further including weighting said higher orders modes for defining said predetermined eddy field shape.

4. The method of claim 1
   wherein the eddy-field metric further comprises a target eddy field shape; and
   wherein the optimizing of the performance functional further comprises minimizing the difference between the target eddy field shape and a predicted eddy field generated based on the performance functional.

5. The method of claim 1 wherein the optimizing of the performance functional further comprises minimizing a predicted eddy-current density pattern generated over an eddy-field producing structure surface based on the performance functional.

6. The method of claim 1 wherein the performance metrics can further comprise at least one of: a net force metric, a net torque metric, a dissipative power metric and an energy metric.

7. The method of claim 1 further comprising:
   forming a plurality of performance metric functions based on the plurality of performance metrics, and
   wherein the performance functional is formed from the plurality of performance metric functions.

8. The method of claim 1 wherein the coil representation is based on a boundary element method.

9. The method of claim 1 wherein the coil surface is cylindrical.

10. The method of claim 1 wherein the eddy-field producing structure is at least one of a bore of a main magnet and end flanges of a main magnet.

11. The method of claim 1 further comprising:
    generating simulated eddy currents based on the optimized performance functional;
    determining compensation currents based on the simulated eddy currents for correcting eddy fields producible by the simulated eddy currents.

12. The method of claim 11 wherein the electromagnet coils are gradient coils and the compensation currents are to be generated by gradient coils during the operation of the MRI.

13. The method of claim 1 wherein the determining further comprises:
    minimizing the eddy fields producible by the simulated eddy currents.

14. The method of claim 1 wherein the electromagnet coils are gradient coils and wherein determining further comprises:
    when the MM is constructed:
       measuring the time and spatial variations of the eddy currents for a pulse sequence; and
       determining the compensation currents based on the measured time and spatial variations of the eddy currents for the pulse sequence.

15. The method of claim 14 further comprising:
    after the determining, storing the compensation currents in association with the pulse sequence.

16. The method of claim 1 wherein the electromagnet coils are one of a main magnet, gradient coils and said correction coils.

17. The method of claim 1, wherein said eddy current density is based on spherical harmonics.

18. The method of claim 11, wherein said compensation currents are generated by shim coils of at least $2^{nd}$ order.

19. The method of claim 11, wherein compensation currents are generated by compensation coils configured to correct for said predicted eddy fields.

20. The method of claim 1, wherein said compensation coils are designed based on one of either measured or simulated eddy currents.

21. An MM system manufactured in accordance with the method of claim 1.

* * * * *